United States Patent [19]

Fishman

[11] Patent Number: 4,499,519
[45] Date of Patent: Feb. 12, 1985

[54] DECOUPLING CAPACITOR AND METHOD OF MANUFACTURE THEREOF

[75] Inventor: David S. Fishman, West Hartford, Conn.

[73] Assignee: Rogers Corporation, Rogers, Conn.

[21] Appl. No.: 552,107

[22] Filed: Nov. 14, 1983

[51] Int. Cl.³ ............... H01G 1/14; H01G 7/00; H01G 9/00
[52] U.S. Cl. .................. 361/306; 29/25.42; 361/433
[58] Field of Search ............... 361/306, 321, 322, 433, 361/392, 393, 402, 404; 174/72 B; 29/25.42

[56] References Cited

U.S. PATENT DOCUMENTS

| | | | |
|---|---|---|---|
| 3,312,771 | 4/1967 | Hessinger et al. ............... | 361/392 X |
| 3,588,629 | 6/1971 | Millard et al. .................. | 361/433 |
| 3,880,493 | 4/1975 | Lockhart ........................ | 339/147 R |
| 4,266,091 | 5/1981 | Fukuda ........................... | 174/72 B |
| 4,356,532 | 10/1982 | Donaher et al. ................ | 361/393 |
| 4,394,713 | 7/1983 | Yoshida .......................... | 361/433 |
| 4,399,321 | 8/1983 | Gottlieb ......................... | 174/72 B |

FOREIGN PATENT DOCUMENTS 41864 10/1974 Japan .
20556 2/1983 Japan .

OTHER PUBLICATIONS

List of Prior Patent Applications 2 pp.

Primary Examiner—Donald A. Griffin
Attorney, Agent, or Firm—Fishman & Dionne

[57] ABSTRACT

A decoupling capacitor and method of manufacture thereof are presented wherein the decoupling capacitor is formed and consists of a molded housing with integrally molded recesses for a capacitive ceramic chip. The housing also is formed with integrally molded recesses and stabilizing tabs for active pins; and either molded recesses and stabilizing tabs for dummy pins, or molded lugs in lieu of dummy pins. Both the active pins and either the dummy pins or molded lugs are on the same height level to promote symmetry and ease of handling.

40 Claims, 7 Drawing Figures

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to a novel and improved decoupling capacitor, and a method of formation thereof particularly adapted to be automatically inserted into printed circuit boards in conjunction with dual-in-line integrated circuits or other electronic components.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

U.S. patent application Ser. No. 456,654 and U.S. application Ser. No. 551,466 of Watson being filed simultaneously herewith, (both of which are assigned to the assignee hereof and incorporated herein by reference) discloses several approaches to solving the above discussed problem by the incorporation of dummy or stabilizing pins or stabilizing lugs in a decoupling capacitor assembly. The present invention presents other constructions and methods for both solving the above discussed problem and forming an improved decoupling capacitor construction, particularly one in which the active pins and dummy pins or stabilizing lugs are all on the same level in the unit.

SUMMARY OF THE INVENTION

The above discussed and other problems of the prior art are overcome or substantially reduced by the new and improved decoupling capacitor of the present invention. Also, several additional advantages in design, assembly, cost and quality are realized with the present invention.

In accordance with the present invention, the capacitor ceramic chip is incorporated into a molded plastic housing. The molded housing has an integrally molded recess to receive and contain the capacitive ceramic chip; and the molded plastic housing is also formed with integrally molded recesses and/or stabilizing tabs to permit active and/or dummy pins to pass through the housing. In accordance with the present invention, the assembly may incorporate projecting stabilizing lugs on the plastic housing in lieu of the dummy pins, or the assembly may incorporate dummy pins. In either event, the dummy pins or projecting lugs are located at diagonally opposite corners to provide a symmetrical pin configuration which eliminates the misalignment problem previously encountered and makes the decoupling capacitor fully suitable for auto insertion into printed circuit boards with standard auto insertion equipment. Furthermore, the active pins and either the dummy pins or the projecting lugs are all at the same level in the assembly to provide improved symmetry and promote ease of handling. Of course, if the power supply pins are not at diagonally opposed locations, the dummy pins or stabilizing lugs will be located at such other locations, as may be dictated by the location of the power supply pins, to balance the power supply pins.

The plastic molded housing of the present invention is in the form of two body or housing halves or segments which are assembled and bonded together to complete the final unit. These housing segments are mating segments; and they are formed with various recesses and stabilizing pads depending on which of several possible design configurations are employed. In all configurations, a moisture barrier is incorporated in the assembly, and various assembly components will be adhesively or otherwise bonded together to provide a sealed package.

Each housing half has a conductive inner surface and a nonconductive area, with the top and bottom half nonconductive areas being at opposite ends of the assembly. Opposite conductive faces of a capacitive chip are in contact, respectively, with the bottom and top conductive surfaces. Both active terminal pins are positioned on the bottom housing half, with one in contact with the conductive inner surface on the bottom housing half and the other in contact with the conductive inner surface on the upper housing half. Thus, both active pins are at the same level. The dummy pins, if used, are also at this same level, so all four pins are on one plane or level.

If projecting stabilizing lugs are used in lieu of dummy pins, the projecting lugs will be located at diagonally opposite corners of the molded plastic housing (or at such other location as needed to balance the power supply pins), and will be on the same half of the housing assembly so all pins and lugs are on one level.

If dummy pins are employed, the dummy pins will be locked into the housing assembly, and they may even be premolded into one or both of the housing assembly components.

Regardless of whether dummy pins are employed or projecting lugs are employed in lieu of dummy pins, the active pins of the assembly will be mechanically locked in place and electrically connected to opposite conductive surfaces of the capacitive element; and these active pins will be positioned in integrally molded recesses and/or passageways in the housing segments and may be firmly held in position by cooperating stabilizing pads on the mating housing segments.

In addition to solving the misalignment problem and being suitable for auto insertion, the decoupling capacitor of the present invention has several other advantages and potentials. The assembly of the present invention is particularly suitable for production in large quantities and presents opportunities for reduced cost (such as in conductors and packaging) with overall improvement in quality.

The above discussed and other advantages of the present invention will be apparent to and understood by those skilled in the art from the following detailed description and drawings.

BRIEF DESCRIPTION OF THE DRAWINGS

Referring now to the several FIGURES of the drawings, wherein like elements are numbered alike in the several FIGURES.

DESCRIPTION OF THE PREFERRED EMBODIMENTS

Figure 1:
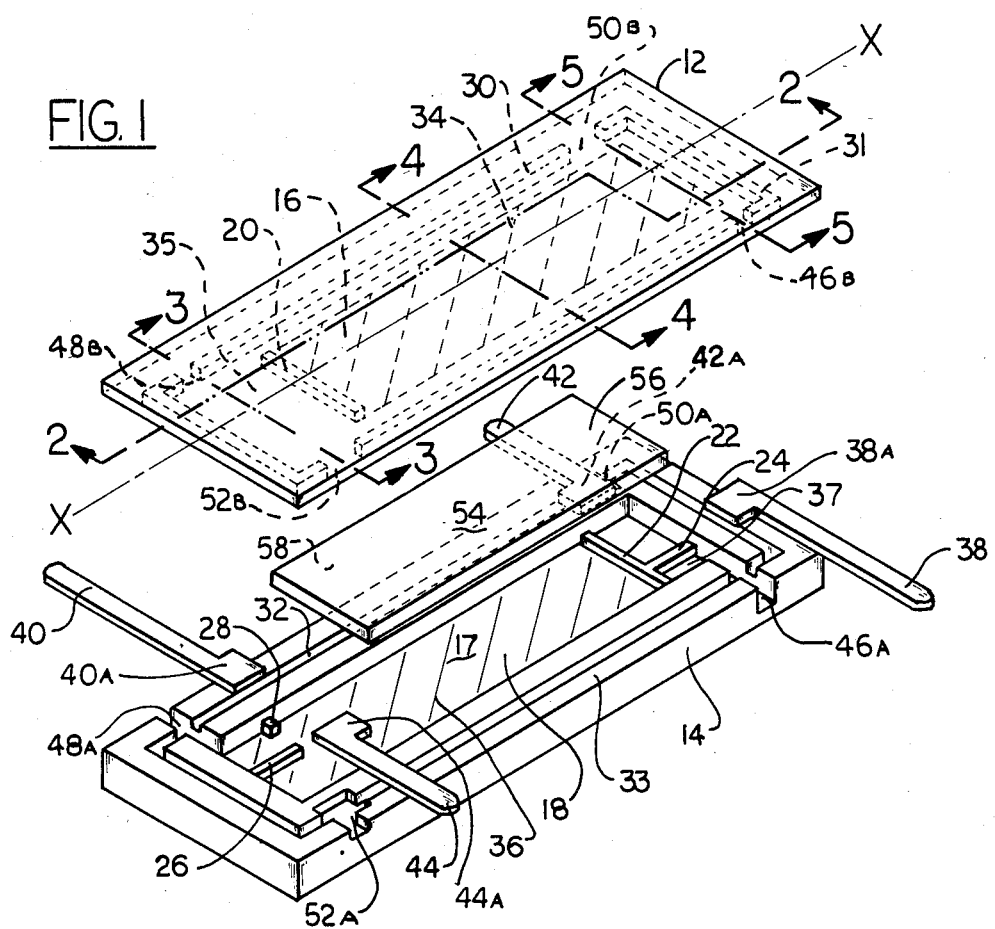
FIG. 1 shows an exploded view of the improved decoupling capacitor of the present invention.
Figure 2:
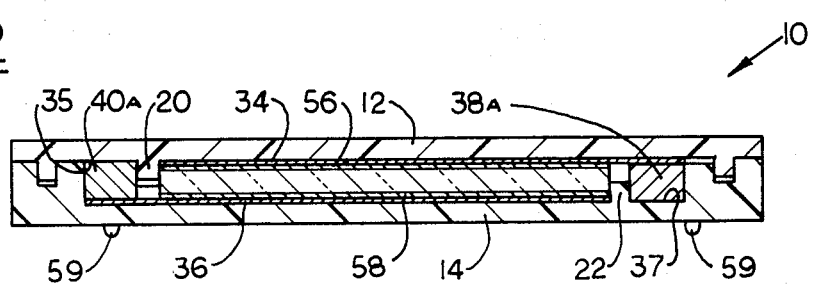
FIG. 2 shows a sectional view along line 2—2 of FIG. 1 of an assembled unit.

Referring jointly to the embodiment of FIGS. 1-5, the decoupling capacitor of the present invention has a housing 10 made up of mating first and second housing segments 12 and 14, which may be referred to as upper and lower housing segments, respectively, since in the principal intended application, segment 14 would be adjacent to a printed circuit board, and housing segment 12 would be on top of housing segment 14. Housing segments 12 and 14 are molded from suitable thermoplastic or thermosetting molding materials. Upper housing segment 12 has an interior face surface 16; and lower housing segment 14 is formed with a recessed pocket 17 with a face surface 18. The surfaces 16 and 18 and pocket 17 cooperate to define an interior cavity for housing a ceramic chip capacitor element.

Upper housing segment 12 has a barrier element 20 perpendicular to the longitudinal axis X—X of the assembly. Barrier element 20 projects downwardly from the face surface 16. Lower housing segment 14 has a barrier element 22 perpendicular to the longitudinal axis X—X of the assembly, and a pair of pin locating elements 24 and 26 parallel to axis X-X, and a chip locating lug 28. The barrier element 22, pin locations 24 and 26 and chip locater 28 all extend above face surface 18.

Upper housing segment 12 has an downwardly projecting sealing rib 30 in boarder section 31 which mates with a recess 32 in border section 33 of lower housing segment 14. Sealing rib 30 and recess 32 mate in a tongue and groove fashion to form a moisture barrier. This rib and groove structure extends entirely around the peripheral border area of the respective housing segments except where interruption is necessary to permit the contact terminals and dummy pins to pass through the housing (as more fully described hereinafter).

A part of face surface 16 of upper housing segment 12 is coated with a layer 34 of electrically conductive material; and a part of face surface 18 of lower housing segment 14 is coated with a layer 36 of electrically conductive material. The extent of the electrically conductive layers 34 and 36 are indicated by the hashmark lines on surfaces 16 and 18 (the hashmarking being only for purposes of assiting in explanation and understanding of the parts of surfaces 16 and 18 which are coated). Thus, the conductive coating 34 on the surface 16 extends from barrier element 20 rightwardly to sealing rib 30; and in the direction perpendicular to axis X—X, coating 34 extends the length of rib 20, i.e., it is within the projection of the inner boundaries of border 33. The conductive coating 36 on surface 18 extends from barrier element 22 leftwardly to the interior edge of border 33 at the left end of the assembly. The electrically conductive coatings 34 and 36 may be deposited by electoplating, or they may be formed by bonding a metallic foil, such as copper, to surfaces 16 an 18. The surface 35 to the left of barrier 20 is nonconductive; and the surface 37 to the right of barrier 22 is nonconductive.

The ceramic chip capacitor is comprised of a rectangularly shaped ceramic body 54 which may, for example, be barium titanate or strontium titanate; and body 54 has conductive upper and lower face surfaces which may be nickel alloy (as disclosed in U.S. application Ser. No. 391,967, assigned to the assignee hereof and incorporated herein by reference). In the completed assembly of a capacitor of the present invention, the capacitor element is housed in recesses 17 with its conductive surfaces 56 and 58 in electrical contact with the conductive surfaces 34 and 36. The capacitor element is adhesively bonded to the conductive surfaces 34 and 36 to effect electrical and mechanical connection. The adhesive is, preferably, a nonconductive adhesive, with electrical contact being effected by differential surface roughness in accordance with U.S. Pat. No. 4,236,038

(assigned to the assignee hereof and incorporated herein by reference). Alternatively, conductive adhesive can be used.

The embodiment of FIGS. 1-5 of the present invention has a pair of active terminal pins 38 and 40, with enlarged rectangular end contact pads 38a and 40a, respectively, and a pair of dummy pins 42 and 44 with enlarged end sections 42a and 44a. Active pin 38 passes through a passageway defined by passage segment 46a in border 33 of lower housing segment 14 and passage segment 46b in border segment 31 of upper housing segment 12. Similarly, active pin 40 passes through a passageway defined by passage segment 48a in border 33 of lower housing segment 14 and passage segment 48b in border 31 of upper housing segment 12. Dummy pin 42 is housed in a pocket defined by recesses 50a and 50b in border segments 33 and 31 of housing segments 14 and 12, respectively; and dummy pin 44 is housed in a pocket defined by recesses 52a and 52b in border segments 33 and 31 of housing segments 14 and 12, respectively.

The relationship and interaction between the active terminal pins 38, 40 the conductive surfaces 36,38 and conductive capacitor clip faces 56,58 are of particular importance in the present invention, as is the relationship and location of dummy pins 42,44. The ceramic chip capacitor is positioned in recess 17 and is located between barrier rib 22 and chip locator lug 28. Thus, barrier rib 22 serves both to define the rightmost extent of conductive surface 36 and to position the ceramic chip capacitor; while lug 28 serves to guide and position the ceramic capacitor chip in assembly. Active pin 38 sits in passage 46a, 46b, with the innermost edge of contact end 38a butted against rib 24 to locate and limit the insertion of pin 38 in the assembly. Similarly, active pin 40 sits in passage 48a, 48b, with the innermost edge of contact end 40a butted against rib 26 to locate and limit the insertion of pin 40 in the assembly. As can best be seen from a joint consideration of FIGS. 1, 2, 3 and 5, in the assembled state, contact pad 40a of pin 40 is in abutting engagement with and retained between conductive surface 36 on lower housing segment 14 and the nonconductive surface 35 to the left of barrier 20; contact pad 38a of pin 38 is in abutting engagement with and retained between conductive surface 34 on upper housing segment 14 and the nonconductive surface 37 to the right of barrier 22; and the ceramic chip capacitor is sandwiched between housing segments 12 and 14 with the conductive surface 34 of housing segment 12 being mechanically and electrically connected to conductive face suface 56 of the ceramic capacitor and with conductive surface 36 of housing segment 14 being mechanically and electrically connected to conductive face surface 58 of the ceramic capacitor. Thus, active pin 38 is electrically connected to conductive face surface 56 of the ceramic capacitor but is electrically isolated from surface 58; and active pin 40 is electrically connected to conductive face surface 58 of the ceramic capacitor but is electrically isolated from surface 56. It is most important to note that although active pins 38 and 40 are electrically connected to opposite face surfaces of the ceramic capacitor, the pins are on the same height level to promote symmetry and ease of handling.

Figure 3:
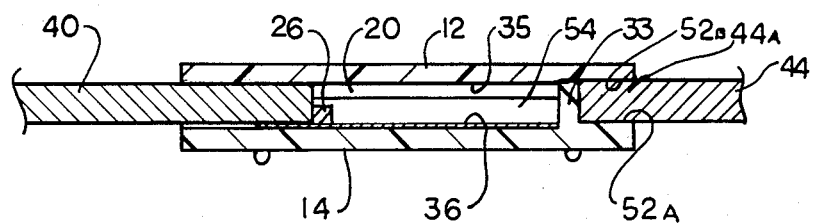
FIG. 3 shows a sectional view along line 3—3 of FIG. 1 of an assembled unit.
Figure 4:
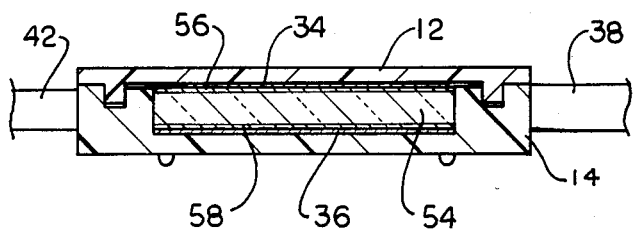
FIG. 4 shows a sectional view along line 4—4 of FIG. 1 of an assembled unit.
Figure 5:
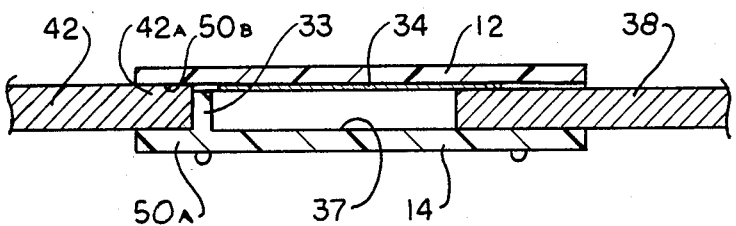
FIG. 5 shows a sectional view along line 5—5 of FIG. 1 of an assembled unit.

Referring to a joint consideration of FIGS. 1, 3 and 5, the location and retention of the dummy pins 42 and 44 can be seen. The enlarged head 42a of dummy pin 42 is located and retained in the pocket 50a, 50b which is entirely in the border area 31, 33; and the enlarged head 44a of dummy pin 44 is located and retained in the pocket 52a, 52b which is also entirely in the border area 31, 33. Thus, the dummy pins 42 and 44 are mechanically retained in the assembly but are electrically isolated from the ceramic capacitor element. The dummy pins 42 and 44 are both on the same height level with each other and with active pin 38, 40. Tnus, all of the pins are on the same height level to promote symmetry and ease of handling.

In the formation and assembly of the unit of FIGS. 1-5, the housing components 12 and 14 are molded. Then, the conductively coated surfaces 34, 36, identified above are coated with conductive material to the extent described previously. Contact or terminal pin 38 is then placed in position to extend through passage 46a, with contact segment 38a on surface 37 and butting against rib 24; and contact terminal pin 40 is placed in passage 48a, with enlarged portion 40a being on surface 36 and butting against rib 26. The dummy pins 42 and 44 are then placed in position with their respective enlarged portions 42a and 44a being received in pocket segments 50a and 52a, and adhesively bonded thereto. The conductive or nonconductive adhesive is then coated onto either chip surfaces 56 and 58 or housing surfaces 34 and 36. The ceramic capacitor chip element is then placed in recess 17 with conductive surface 58 in contact with conductive surface 36. Top housing segment 12 is then placed on top of bottom housing segment 14, with sealing rib 30 interlocking in tongue and groove arrangement with peripheral recess 32. This brings conductive surface 34 into contact with chip conductive surface 36 and with contact pad 38a. The border areas 31 and 33 and the sealing rib 30 and/or recess 34 may be coated with an appropriate adhesive to entirely seal the assembly and complete the moisture barrier mechanism.

As previously noted, the dummy pins 42 and 44 are mechanically and electrically isolated from the capacitor chip and any of the conductive surfaces. This insures that the dummy pins remain electrically isolated so that they serve only to provide geometric balance and as mechanical stabilizers for auto insertion. It will also be understood that the housing segments are sized and cooperate to lock and stabilize the active pins and dummy pins in place mechanically as well as providing pressure surfaces to urge the active pins 38 and 40 and their enlarged end portions 38a, 40a into conductive contact with the respective conductive surfaces 34, 36. Also as previously noted, the enlarged contact surface 38a of pin 38 is in mechanical and electrical contact with the conductive surface 34, thus putting that pin in electrical contact with conductive surface 56 of the capacitive element. Similarly, the enlarged contact portion 40a of pin 40 is in mechanical and electrical contact with the conductive surface 36 so that pin 40 is electrically connected to conductive surface 58 of the capacitive chip. Thus, the pins 38 and 40 are connected across the opposite surfaces of the capacitor to provide decoupling capacitance when connected into a circuit.

Figure 7:
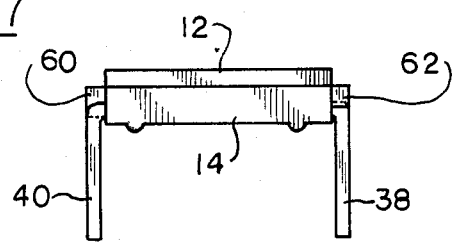
FIG. 7 shows an end view of an assembled unit after the active pins have been bent down.

The final step in assembly of the embodiment of FIGS. 1-5 will be to bend the active and dummy pins 90° downwardly (as with pins in FIG. 7). The unit is then ready for insertion into a printed circuit board, with the active and dummy pins providing geometric balance and axial symmetry for the unit to be engaged by the jaws of auto insertion machinery.

It will be noted that the dummy pins 60 and 64 could be integrally molded into the housing at the time of molding of the housing rather than placing them in position during assembly as described above. Note, also, that a pair of semicylindrical ribs (or a series of semispherical buttons) 59 is present on the bottom of lower housing segment 14 to slightly elevate the unit above the PC board on which it will be mounted for cooling and/or cleaning purposes.

Figure 6:
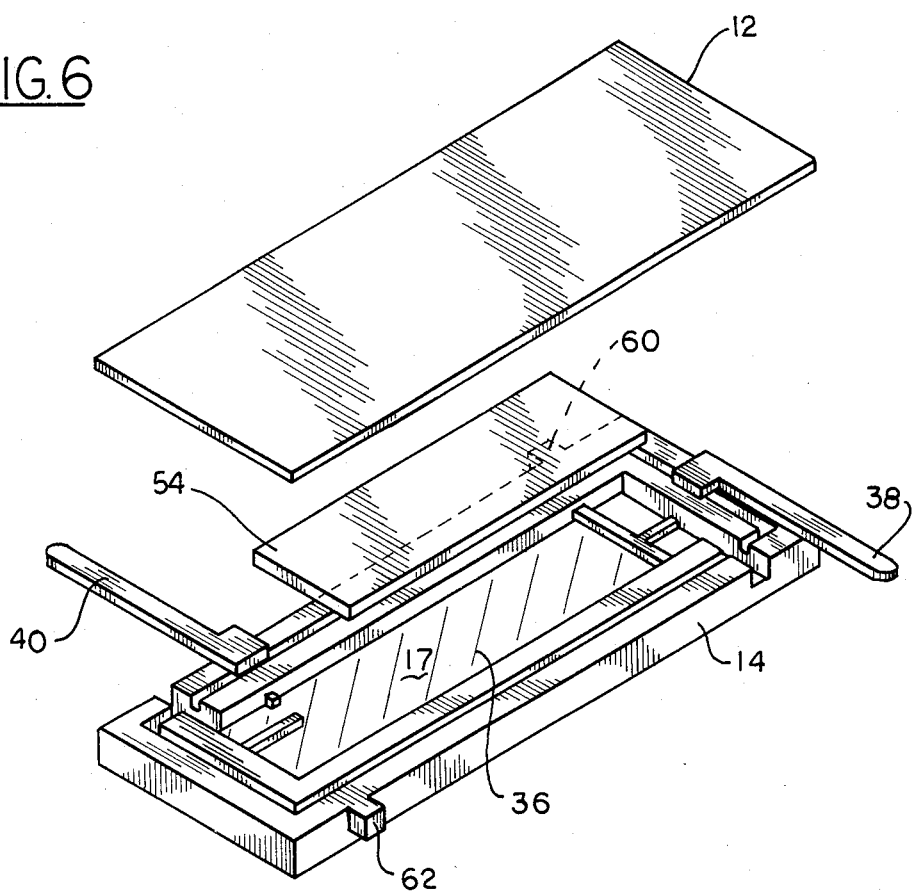
FIG. 6 shows a view similar to FIG. 1 of an alternative configuration with projecting stabilizing lugs in lieu of dummy pins.

Referring now to FIGS. 6 and 7, an alternative embodiment is shown which differs from the embodiment of FIGS. 1–5 only in that they dummy pins are replaced by stabilizing lugs 60 and 62. These stabilizing lugs also provide the necessary geometric symmetry and axial balance for the assembled unit to be engaged by the jaws of auto insertion machinery. The stabilizing lugs 60 and 62 are also on the same height level as active pins 38 and 40, so that the feature of the present invention of enhancement of stability and symmetry is also embodied in the structure of FIGS. 6 and 7.

While the invention has been described in terms of structure having a pair of active pins at first diametrically opposed positions and a pair of dummy pins or lugs at a second pair of diametrically opposed positions, it is to be understood that such structure is illustrative and not limiting. Other active pin numbers and/or arrangements may be employed depending on the design and requirements of the integrated circuit with which the decoupling capacitor is to be used; and the number and location of dummy pins and/or stabilizing lugs will be as required to provide the desired stability and balance for auto insertion. In all cases, however, the active and dummy pins and/or stabilizing lugs will be on the same level to enhance stability and balance in accordance with the present invention.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A capacitor including:
   a first molded housing segment;
   a first border segment around the periphery of said first molded housing segment;
   a second molding housing segment;
   a second border segment around the periphery of said second molded housing segment;
   said first and second border segments being in facing and abutting contact and being bonded together;
   a recess in at least one of said molded housing segments;
   said first and second molded housing segments cooperating to define within said border segments an interior cavity having opposed first and second face surfaces, said first face surface being on said first molded housing segment and said second face surface being on said second molded housing segment;
   a first layer of electrically conductive material on a first part of said second face surface of said first housing segment, a second part of said first face surface being electrically nonconductive;
   a second layer of electrically conductive material on part of said second face surface of said second housing segment, a second part of said second face surface being electrically nonconductive;
   a flat dielectric element in said cavity, said dielectric element having first and second opposed faces, with a first electrically conductive layer on said first face and a second electrically conductive layer on said second face;
   said first layer of electrically conductive material on said first part of said first face surface of said first housing segment being physically and electrically connected to said first electrically conductive layer on said dielectric element, and said second layer of electrically conductive material on said first part of said second face surface of said second housing segment being physically and electrically connected to said second electrically conductive layer on said dielectric element;
   first electrically conductive terminal pin means sandwiched between said first part of said first face surface of said first housing segment and said second part of said second face surface of said second housing segment, said first electrically conductive terminal pin means being electrically connected to said first layer of electrically conductive material on said first part of said first face surface of said first housing element;
   second electrically conductive terminal pin means sandwiched between said second part of said first face surface of said first housing segment and said first part of said second face surface of said second housing segment, said second electrically conductive terminal pin means being electrically connected to said second layer of electrically conductive material on said first part of said second face surface of said second housing element; and
   passage means in at least one of said border segments for passage of said first and second terminal pins.

2. The capacitor of claim 1 including:
   first and second inactive pins retained in said housing segments, said inactive pins being positioned to be electrically isolated from said first and second layers of electrically conductive material and said first and second electrically conductive layers on said dielectric element and to balance said first and second terminal pins.

3. The capacitor of claim 2 including:
   moisture barrier means in said first and second border areas.

4. The capacitor of claim 1 including:
   first and second projecting lugs, said lugs being on at least one of said housing segments, said lugs being positioned to balance said first and second terminal pins.

5. The capacitor of claim 4 including:
   moisture barrier means in said first and second border areas.

6. The capacitor of claim 1 including:
   first terminal pin locating means in said second part of said face surface of said second housing segment;
   second terminal pin locating means in said first part of said face surface of said second housing segment;
   said first electrically conductive terminal pin means having a connector section positioned by said first pin locating means; and
   said second electrically conductive terminal pin means having a connector section positioned by said second pin locating means.

7. The capacitor of claim 6 including:
   first and second inactive pins retained in said housing segments, said inactive pins being positioned to be electrically isolated from said first and second layers of electrically conductive material and said first and second electrically conductive layers on said dielectric element and to balance said first and second terminal pins.

8. The capacitor of claim 7 including:
moisture barrier means in said first and second border areas.

9. The capacitor of claim 6 including:
first and second projecting lugs, said lugs being on at least one of said housing segments, said lugs being positioned to balance said first and second terminal pins.

10. The capacitor of claim 9 including:
moisture barrier means in said first and second border areas.

11. The capacitor of claim 1 including:
first barrier means on said first face surface of said first housing segment to divide said first face surface into said first and second parts thereof;
second barrier means on said second face surface of said second housing segment to divide said second face surface into said first and second parts thereof.

12. The capacitor of claim 11 wherein:
said dielectric element is positioned between said first and second barrier elements.

13. The capacitor of claim 11 including:
locating means on said second housing segment for locating said dielectric element in said second housing segment.

14. The capacitor of claim 11 wherein:
said first layer of electrically conductive material extends from said first barrier means and overlaps said second part of said second face surface of said second housing segment; and
said second layer of electrically conductive material extends from said second barrier means and overlaps said second part of said first face surface of said first housing segment.

15. The capacitor of claim 14 wherein:
said dielectric element is positioned between said first and second barrier elements.

16. The capacitor of claim 14 including:
locating means on said second housing segment for locating said capacitive element in said second housing segment.

17. The capacitor of claim 11 including:
first and second inactive pins retained in said housing segments, said inactive pins being positioned to be electrically isolated from said first and second layers of electrically conductive material and said first and second electrically conductive layers on said dielectric element and to balance said first and second terminal pins.

18. The capacitor of claim 17 including:
moisture barrier means in said first and second border areas.

19. The capacitor of claim 11 including:
first and second projecting lugs, said lugs being on at least one of said housing segments, said lugs being positioned to balance said first and second terminal pins.

20. The capacitor of claim 19 including:
moisture barrier means in said first and second border areas.

21. A method of forming a capacitor including the steps of:
forming a first molded housing segment having a first border segment around the periphery of said first molded housing segment;
forming a second molding housing segment having a second border segment around the periphery of said second molded housing segment;
at least one of said border segments having passage means for passage of terminal pins;
at least one of said molded housing segments having a recess therein;
said first and second molded housing segments cooperating to define within said border segments an interior cavity having opposed first and second face surfaces, said first face surface being on said first molded housing segment and said second face surface being on said second molded housing segment;
forming a first layer of electrically conductive material on a first part of said second face surface of said first housing segment, a second part of said first face surface being electrically nonconductive;
forming a second layer of electrically conductive material on a first part of said second face surface of said second housing segment, a second part of said second face surface being electrically nonconductive;
positioning a flat dielectric element in said cavity, said dielectric element having first and second opposed faces, with a first electrically conductive layer on said first face and a second electrically conductive layer on said second face;
positioning first electrically conductive terminal pin means in contact with said first part of said first face surface of said first housing segment;
positioning second electrically conductive terminal pin means in contact with said second part of said first face surface of said first housing segment;
bringing said first and second housing segments together and bonding said first and second border segments together;
said first layer of electrically conductive material on said first part of said first face surface of said first housing segment being physically and electrically connected to said first electrically conductive layer on said dielectric element, and said second layer of electrically conductive material on said first part of said second face surface of said second housing segment being physically and electrically connected to said second electrically conductive layer on said dielectric element;
said first electrically conductive terminal pin means being sandwiched between said first part of said first face surface of said first housing segment and said second part of said second face surface of said second housing segment, said first electrically conductive terminal pin means being electrically connected to said first layer of electrically conductive material on said first part of said first face surface of said first housing element; and
said second electrically conductive terminal pin means being sandwiched between said second part of said first face surface of said first housing segment and said first part of said second face surface of said second housing segment, said second electrically conductive terminal pin means being electrically connected to said second layer of electrically conductive material on said first part of said second face surface of said second housing element.

22. The method of claim 21 including the step of:
positioning first and second inactive pins in at least one of said housing segments, said inactive pins being positioned to be electrically isolated from said first and second layers of electrically conductive material and said first and second electrically conductive layers on said dielectric element and to balance said first and second terminal pins.

23. The method of claim 22 including the step of:
forming moisture barrier means in said first and second border areas.

24. The method of claim 21 including the step of:
forming first and second projecting lugs on at least one of said housing segments, said lugs being positioned to balance said first and second terminal pins.

25. The method of claim 24 including the step of:
forming moisture barrier means in said first and second border areas.

26. The method of claim 21 including the step of:
forming first terminal pin locating means in said second part of said face surface of said second housing segment;
forming second terminal pin locating means in said first part of said face surface of said second housing segment;
said first electrically conductive terminal pin means having a connector section positioned by said first pin locating means; and
said second electrically conductive terminal pin means having a connector section positioned by said second pin locating means.

27. The method of claim 26 including the step of:
positioning first and second inactive pins in at least one of said housing segments, said inactive pins being positioned to be electrically isolated from said first and second layers of electrically conductive material and said first and second electrically conductive layers on said dielectric element and to balance said first and second terminal pins.

28. The method of claim 27 including the step of:
forming moisture barrier means in said first and second border areas.

29. The method of claim 26 including the step of:
forming first and second projecting lugs on at least one of said housing segments, said lugs being positioned to balance said first and second terminal pins.

30. The method of claim 29 including the step of:
forming moisture barrier means in said first and second border areas.

31. The method of claim 21 including the steps of:
forming first barrier means on said first face surface of said first housing segment to divide said first face surface into said first and second parts thereof; and
forming second barrier means on said second face surface of said second housing segment to divide said second face surface into said first and second parts thereof.

32. The method of claim 31 wherein the step of positioning the dielectric element includes:
positioning said dielectric element between said first and second barrier elements.

33. The method of claim 31 including the step of:
forming locating means on said second housing segment for locating said dielectric element in said second housing segment.

34. The method of claim 31 wherein the steps of forming first and second layers of electrically conductive material includes:
forming said first layer of electrically conductive material to extend from said first barrier means and overlap said second part of said second face surface of said second housing segment; and
forming said second layer of electrically conductive material to extend from said second barrier means and overlap said second part of said first face surface of said first housing segment.

35. The method of claim 34 wherein:
said dielectric element is positioned between said first and second barrier elements.

36. The method of claim 34 including the step of:
forming locating means on said second housing segment for locating said dielectric element in said second housing segment.

37. The method of claim 31 including the step of:
positioning first and second inactive pins in at least one of said housing segments, said inactive pins being positioned to be electrically isolated from said first and second layers of electrically conductive material and said first and second electrically conductive layers on said dielectric element and to balance said first and second terminal pins.

38. The method of claim 37 including the step of:
forming moisture barrier means in said first and second border areas.

39. The method of claim 31 including the step of:
forming first and second projecting lugs, said lugs being on at least one of said housing segments, said lugs being positioned to balance said first and second terminal pins.

40. The capacitor of claim 39 including the step of:
forming moisture barrier means in said first and second border areas.

* * * * *